United States Patent
Tatum et al.

(10) Patent No.: US 7,508,047 B2
(45) Date of Patent: Mar. 24, 2009

(54) VERTICAL CAVITY SURFACE EMITTING LASER WITH INTEGRATED ELECTROSTATIC DISCHARGE PROTECTION

(75) Inventors: Jimmy A. Tatum, Plano, TX (US); James K. Guenter, Garland, TX (US); Jose Joaquin Aizpuru, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/091,179

(22) Filed: Mar. 28, 2005

(65) Prior Publication Data
US 2006/0118877 A1 Jun. 8, 2006

Related U.S. Application Data

(60) Provisional application No. 60/633,101, filed on Dec. 3, 2004.

(51) Int. Cl.
*H01L 31/058* (2006.01)
(52) U.S. Cl. .......... 257/462; 257/197; 257/E25.032; 372/50.11; 372/50.124
(58) Field of Classification Search .......... 257/707, 257/462, 197; 372/50.124, 50.11
See application file for complete search history.

(56) References Cited

U.S. PATENT DOCUMENTS

| | | | | |
|---|---|---|---|---|
| 5,132,982 A * | 7/1992 | Chan et al. | ............. | 372/50.124 |
| 5,528,064 A * | 6/1996 | Thiel et al. | ................... | 257/362 |
| 5,577,064 A * | 11/1996 | Swirhun et al. | ........ | 372/50.124 |
| 6,054,716 A * | 4/2000 | Sonobe et al. | ............... | 250/552 |
| 6,185,240 B1 * | 2/2001 | Jiang et al. | ............. | 375/50.124 |
| 6,593,597 B2 * | 7/2003 | Sheu | ........................... | 257/94 |
| 2005/0271107 A1 * | 12/2005 | Murakami et al. | ......... | 372/50.1 |
| 2007/0258500 A1 * | 11/2007 | Albrecht et al. | .......... | 372/50.11 |

OTHER PUBLICATIONS

850nm VCSELs Vertical Cavity Surface Emitting Lasers 2 pages Jan. 2006, Seiko Epson Corporation.

* cited by examiner

*Primary Examiner*—Wael M Fahmy
*Assistant Examiner*—John C Ingham
(74) *Attorney, Agent, or Firm*—Workman Nydegger

(57) ABSTRACT

An electrostatic discharge (ESD) protected semiconductor device. The semiconductor device is formed as a monolithic structure. The monolithic structure includes a vertical cavity surface emitting laser (VCSEL) and a protection diode. The protection diode cathode is electrically coupled to the VCSEL anode and the protection diode anode is electrically coupled to the VCSEL cathode so as to provide ESD protection to the VCSEL.

2 Claims, 3 Drawing Sheets

VERTICAL CAVITY SURFACE EMITTING LASER WITH INTEGRATED ELECTROSTATIC DISCHARGE PROTECTION

CROSS-REFERENCE TO RELATED APPLICATIONS

This application claims the benefit of U.S. Provisional Application No. 60/633,101, titled "Vertical Cavity Surface Emitting Laser with Integrated Electrostatic Discharge Protection" filed Dec. 3, 2004, which is incorporated herein by reference.

BACKGROUND OF THE INVENTION

1. The Field of the Invention

The invention generally relates to electrostatic discharge (ESD) protection for vertical cavity surface emitting lasers (VCSELs). More specifically, the invention relates to electrostatic discharge protection using integrated protective devices.

2. Description of the Related Art

Semiconductor devices have in recent times become nearly ubiquitous in their use. For example, semiconductor device are found in computer systems, televisions, radios, lighting control, amplifiers, etc. One particular area that semiconductors have found use is in light generating devices such as light emitting diodes (LEDs) and semiconductor lasers. One type of semiconductor laser is the vertical cavity surface emitting laser (VCSEL). VCSELs are formed on a semiconductor substrate by stacking a bottom distributed Bragg reflector (DBR) mirror on the substrate, an active region, including a pn diode junction, on the bottom DBR mirror and a top DBR mirror on the active region. Appropriate metal contacts are also formed on the VCSEL to provide contacts for applying appropriate bias and signal voltages.

One challenge that presents itself in semiconductor device use is the prevalence of electrostatic discharges (ESDs). ESDs result when static electricity builds up on one object and discharges into a second object at a different voltage potential. Static voltage potential differentials can be very high voltages, in the thousands of volts. ESDs through semiconductor junctions result in high peak current outputs that can damage or destroy the semiconductor devices. The rate of current rise can also cause current to pass through a semiconductor device in a normally non-conducting region, such as through oxide regions. This is due, in the oxide region case, to the capacitive nature of the oxide region and the alternating current like behavior of rising currents. Once current has passed through these non-conducting regions, the non-conducting regions may become at least partially conducting even for DC currents, creating a region where it becomes likely that the semiconductor will fail.

Several models exist for describing ESDs, including namely human, machine and charged device models. Each of these models is used to illustrate different impedances that may exist in the sources of an ESD. These three models are illustrated in FIGS. 1A, 1B, and 1C which illustrate the human, machine and charged devices models respectively.

Referring now to FIG. 1A, the human ESD model is illustrated. FIG. 1A illustrates a direct current (DC) power source 102. At a time $t_1$, a switch 104 is closed to charge a capacitor 106. This models a static charge build-up. In actual practice, a charge may build up on an object when objects, especially when the objects are made of plastic or rubber materials, are rubbed against each other. When one object has more positively or negatively charged particles than another, there is a voltage between the two objects. With static charge build-up, this voltage may vary from zero to very high voltages in the thousands of volts or more. At a time $t_2$, the switch 104 opens leaving a static charge on the capacitor 106.

In the human ESD model shown in FIG. 1A, various impedances are modeled. For example, FIG. 1A illustrates a resistor 108 which models the natural electrical resistance of the human body to current flow. In DC circuits, the resistor 108 provides a constant impedance to the DC current. A typical value for resistance of the human body is about 1500Ω. The human body model further includes an inductor 110. The inductor 110 represents inductances that exist in a discharge path such as through the leads of an object that is an electronic component, or through other electrical paths. Inductance impedes DC current flow according to an exponential relationship varying over time. As time increases from when a DC voltage is first applied to the inductor, the impedance from the inductor decreases. Illustratively, in the human model, at time $t_3$, the charge built up on the capacitor 106 is discharged through a component 112 through the resistor 108 and the inductor 110 by closing a switch 114. The impedance of the resistor 108 and inductor 110 provides some protection to the component 112. However, depending on the type of component 112, the voltages and currents developed through the component 112 may cause irreparable harm.

A case more severe than the human discharge model shown in FIG. 1A is the machine discharge model shown in FIG. 1B. This model is similar to the human discharge model except that the resistor 108 of FIG. 1A is absent. This model represents an object with a charge build-up coming in direct contact with an object, such as a metal plane or other surface with a different charge. The charge build up discharges through the component 112 through the inductor 110 which represents inductances that exist in a discharge path such as through the leads of an electronic component or through other electrical paths. In the machine discharge model, the inductor 110 limits some of the severity of the discharge into the component 112.

Yet an even more severe case is the charged device discharge model illustrated in FIG. 1C. In this model, there is neither a resistor nor an inductor to protect the component 112. Thus lower voltage may cause severe damage to the component 112 when an electrostatic discharge discharges through the component 112.

Exposure to ESDs is one very common cause of VCSEL failure. Further, the smaller an aperture of emission in the VCSEL, the lower the amount of ESD voltage a VCSEL can withstand. As an example, a VCSEL with a aperture diameter of about 5 microns may be damaged when ESD levels are on the order of about 100V using the human ESD model. Smaller apertures are often used in single mode VCSELs. Thus single mode VCSELs may be more susceptible to ESDs than other types of VCSELs To protect devices from electrostatic discharge, external components may be used to limit the amount of current through a component or to provide an alternate path for the discharge. However, using external components significantly increases the total size of packaging needed. This may be less desirable when there is a need or advantage to having smaller component packaging. Therefore, what would be new and useful is electrostatic discharge protection that can be implemented without significantly increasing the size of components.

BRIEF SUMMARY OF THE INVENTION

One embodiment includes a semiconductor device constructed as a monolithic structure. The monolithic structure includes; a vertical cavity surface emitting laser (VCSEL); and a protection diode coupled to the VCSEL. The protection diode cathode is electrically coupled to the VCSEL anode and the protection diode anode is electrically coupled to the VCSEL cathode. This construction provides electrostatic discharge (ESD) protection to the VCSEL.

Another embodiment includes a method of manufacturing a semiconductor device. The method includes forming a monolithic structure. Forming the monolithic structure includes forming a vertical cavity surface emitting laser (VCSEL). The method further includes forming a protection diode coupled to the VCSEL. The protection diode cathode is electrically coupled to the VCSEL anode. The protection diode anode is electrically coupled to the VCSEL cathode so as to provide electrostatic discharge (ESD) protection to the VCSEL.

Another embodiment includes a semiconductor device. The semiconductor device is formed as a monolithic structure. The monolithic structure includes a vertical cavity surface emitting laser (VCSEL). The monolithic structure further includes a photodiode connected to the VCSEL. The photodiode is located in the vertical axis with the VCSEL. The monolithic structure further includes a protection diode removed from the vertical axis. The protection diode is connected to the VCSEL. The protection diode cathode is electrically connected to the VCSEL anode and the protection diode anode is electrically connected to the VCSEL cathode so as to provide electrostatic discharge (ESD) protection to the VCSEL.

Advantageously, the embodiments described above provide ESD protection to VCSEL devices by using monolithically formed protection diodes. By forming the protection diodes monolithically with the VCSELs, cost can be reduced as the need for additional external components to provide ESD protection is obviated. Additionally, by including the protection diode monolithically with the VCSEL, package size may be reduced in some embodiments as compared to applications where external protection diodes are used.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

One exemplary embodiment includes a monolithic structure that includes ESD protection. The ESD protection may be provided by a Zener diode. The Zener diode may be included as a pn junction formed, in one embodiment, monolithically above or below the VCSEL. Alternatively, in another embodiment, the Zener diode is formed in a layers formed monolithically near the VCSEL layers, but the Zener diode is formed in a region not directly above or below the VCSEL. This second exemplary embodiment allows for characteristics of the Zener diode to be controlled by controlling the physical shape of the Zener diode.

Figure 1B:
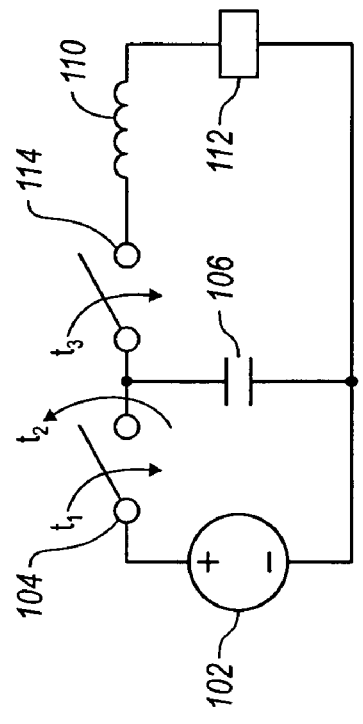
FIG. 1B illustrates a machine discharge model.
Figure 1C:
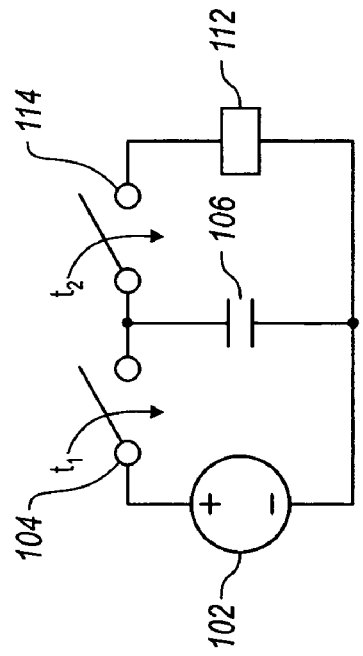
FIG. 1C illustrates a charged device discharge model.
Figure 1A:
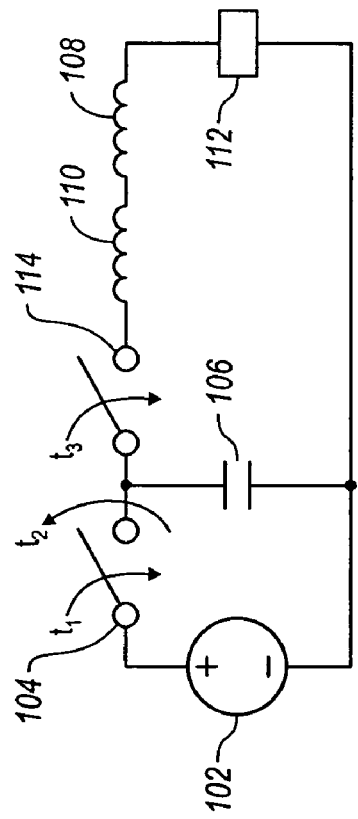
FIG. 1A illustrates a human discharge model.
Figure 2:
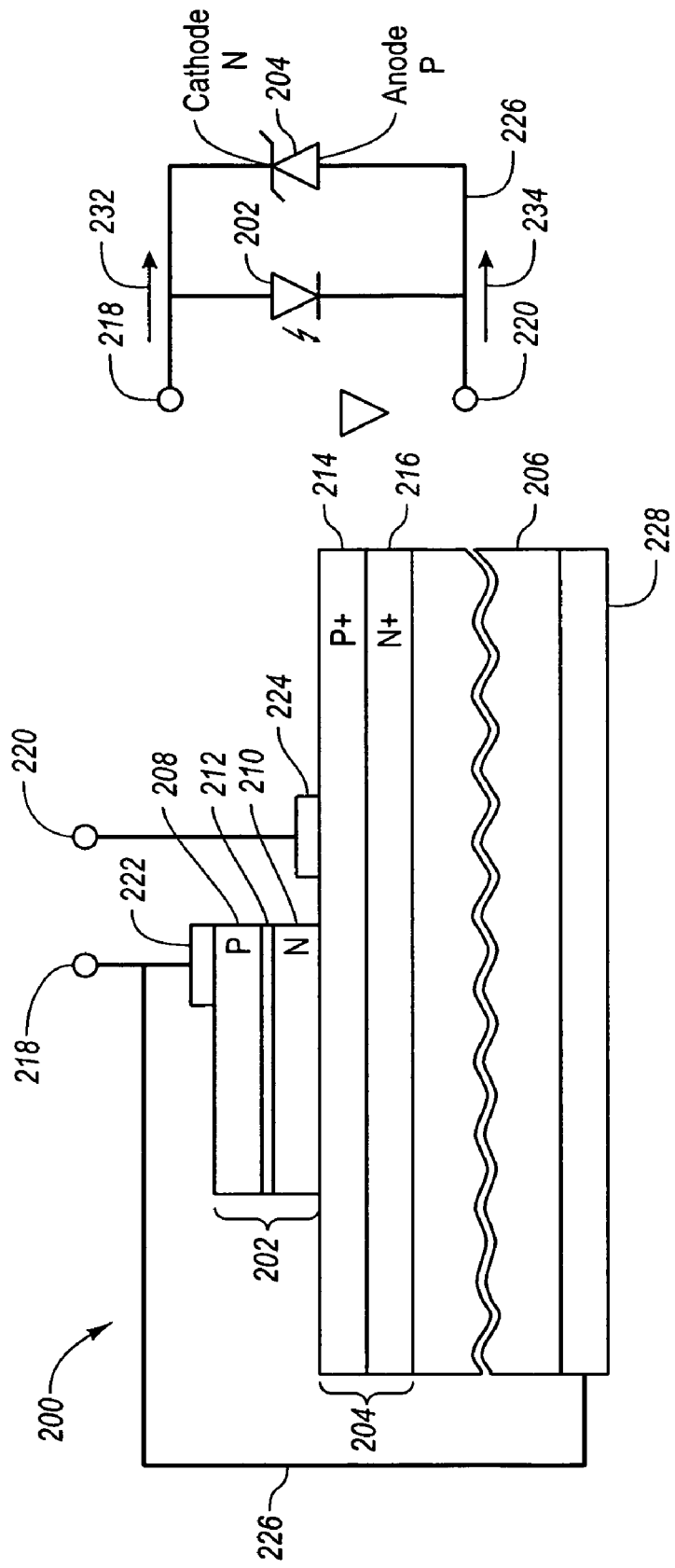
FIG. 2 illustrates one embodiment of a monolithic structure that includes electrostatic discharge (ESD) protection.

Referring now to FIG. 2, an illustrative example of one embodiment is shown. FIG. 2 illustrates an epitaxial view of a monolithic structure 200 that includes a VCSEL 202 and protective diode 204. The VCSEL 202 and protective diode 204 are formed on a substrate 206. In the example shown, the VCSEL 202 includes a top mirror 208 which in this example is a p type mirror. The VCSEL 202 further includes and an n type bottom mirror 210. The top and bottom mirrors 208, 210 are distributed Bragg reflector (DBR) mirrors. DBR mirrors are formed from alternating layers of higher and lower index of refraction materials causing refraction so as to create highly reflective surfaces. The DBR mirrors 208, 210 form the laser cavity of the VCSEL 202. Photons are produced in an active region 212. Photons produced in the active region may be reflected in the cavity formed by the DBR mirrors 208, 210.

In the example shown in FIG. 2, a protective diode 204 is formed axially in the vertical axis with the VCSEL 202. The vertical axis, as used herein refers to the axis running substantially perpendicular to the DBR mirror layers. While the VCSEL 202 may be rotated in various orientations so that different axis are vertical, for convenience and consistency with common descriptions of VCSELs, the above definition of vertical axis will be used herein.

The protective diode 204 shown in FIG. 2 includes a heavily doped p layer 214 and a heavily doped n layer 216. In one embodiment, the heavily doped n layer may be doped on the order of $10^{18}$ to $10^{19}$ atoms/cm$^3$. An example of a monolithic structure including a diode formed below a VCSEL is described in U.S. patent application Ser. No. 10/877,915 titled Light Emitting Device With an Integrated Monitor Photodiode, which is incorporated herein in its entirety.

As is illustrated in FIG. 2, various interconnections are made so as to create an appropriate circuit topology for protecting the VCSEL 202. The embodiment shown in FIG. 2 is a two terminal device meaning that two leads 218, 220 are externally accessible for providing bias and signal voltages to the VCSEL 202. A first lead 218 is connected to the VCSEL 202 anode through a metal deposition contact 222 formed on or near the p type DBR mirror 208. A second lead 218 is connected to the VCSEL 202 cathode and the protection diode 204 anode through a metal deposition contact 224 which forms a common connection at the n type DBR mirror 210 of the VCSEL and the p+ layer 214 of the protection diode 204.

A common connection 226 is shown between the cathode of the protection diode 204 and the anode of the VCSEL 202. This common connection may be accomplished in several different ways. For example, metal depositions may be used in the fabrication process to form the common connection 226. Alternatively, wire bonding may be used to connect a metal deposition 228 formed on the under side of the substrate 206 to the metal deposition contact 222 formed on or near the p type DBR mirror 208. In yet another embodiment, the device shown in FIG. 2, while shown as a two terminal device, may be a three terminal device with a lead connected to the metal deposition 228 formed on the underside of the substrate. In the latter example, the common connection 226 between the protection diode 204 anode and the VCSEL 202 cathode may be formed using an external jumper.

Various advantages may be realized by implementing the common connection 226 in the different fashions illustrated above. For example, when the common connection 226 is made internally, such as when metal depositions or wire bonds are used, the device shown in FIG. 2 may be constructed as a two terminal ESD protected VCSEL. Using two terminals allows for smaller packaging and reduced construction cost as compared to devices with more terminals. In contrast, when the device shown in FIG. 2 is constructed as a three terminal device, various other advantages are available. For example the external common connection 226 may be removed after the component is installed or at other times when there is a lower risk of ESD damage. This would allow the protection diode 204 to be used as an integrated monitor photodiode such as the integrated monitor photodiode illustrated in the U.S. patent application Ser. No. 10/877,915, titled Light Emitting Device With an Integrated Monitor Photodiode previously cited herein.

Figure 3:
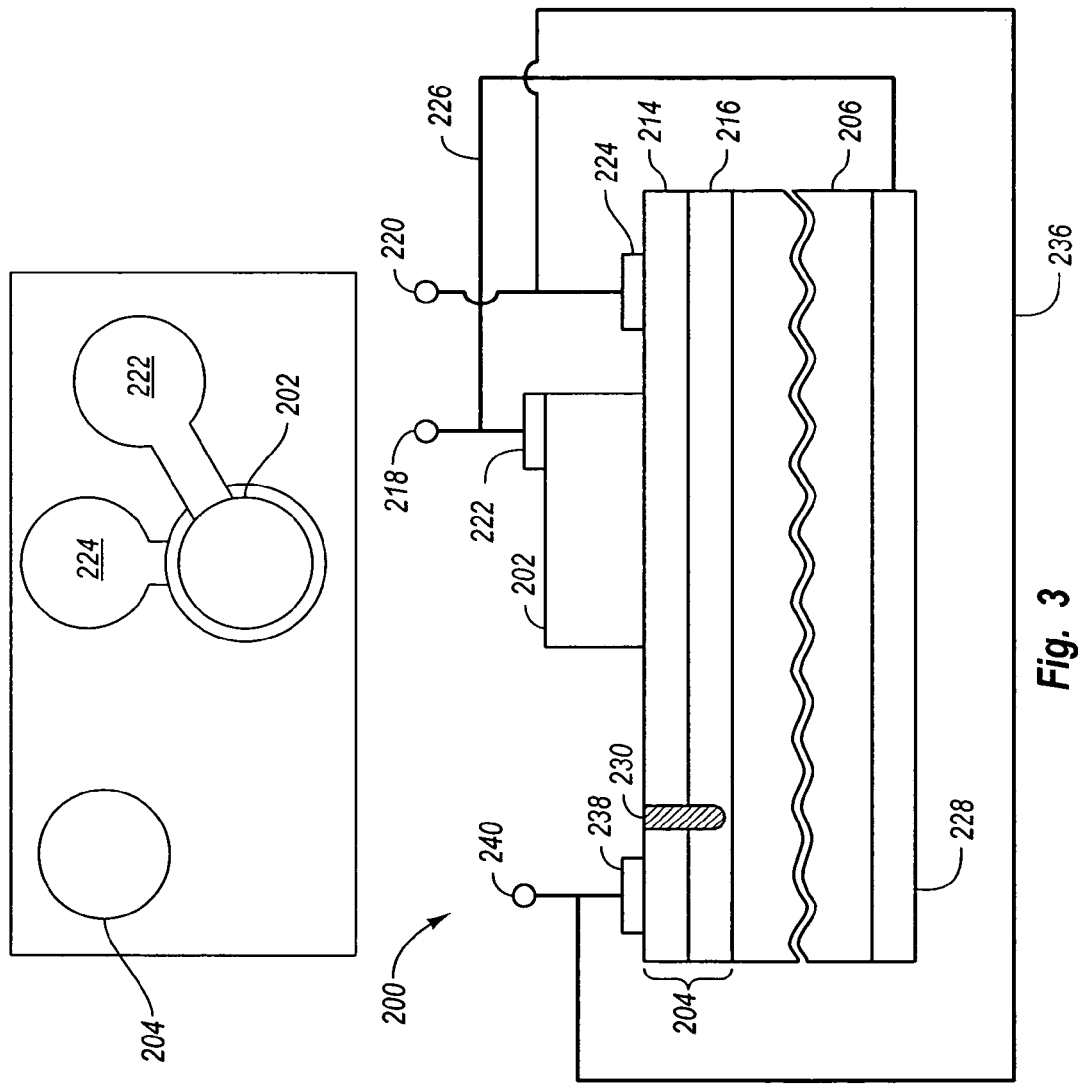
FIG. 3 illustrates another embodiment of a monolithic structure that includes electrostatic discharge (ESD) protection.

While in the example shown in FIG. 2, the protection diode 204 is illustrated as being formed axially in the vertical axis directly below the VCSEL 202, other configurations may also be implemented. In particular, FIG. 3 illustrates an example when the protection diode 204 is formed in a region not directly under the VCSEL 202 in the vertical axis. By forming the protection diode 204 in a region removed from the VCSEL 202 there is more flexibility in controlling characteristics of the protection diode 204. For example, characteristics of the protection diode 204 can be controlled by controlling the size and shape of the protection diode 204. In the embodiment illustrated in FIG. 3, an n+ layer 216 and a p+ layer 214 are formed on a substrate 206. A VCSEL 202 is formed on the p+ layer 214. As a part of forming the protection diode 204, an isolation barrier 230 is formed or implanted in the n+ layer 216 and the p+ layer 214. The isolation barrier 230 is used to define the edges, and thus the size of the protection diode 204.

To provide ESD protection using the protection diode 204, the anode of the protection diode 204 is connected to the cathode of the VCSEL 202 by using a common connection 226 to connect the metal deposition 206 formed on the underside of the substrate to the metal deposition 222 formed on the top of the VCSEL 202. The cathode of the protection diode 204 is connected to the anode of the VCSEL through a common connection 236, which connects the metal deposition 238 formed on the p type layer 214 of the protection diode 204 to the metal deposition 224 which is electrically connected to the bottom of the VCSEL 204.

A reverse biased ESD traveling in a reverse bias direction 234, on the VCSEL 202 will pass through the protection diode 204. This is because in the reverse bias direction 234, the path through the forward biased protection diode 204 is an easier path to travel. This provides reverse bias ESD protection to the VCSEL 204. Reverse bias ESDs are among the most harmful ESDs to VCSEL junctions.

In many embodiments, it is beneficial to tailor the protection diode 204 to optimize it for use in protecting the VCSEL 202 from forward biased ESDs. For example, the VCSEL 202 may be designed such that it has a voltage drop of 1.5 volts and an in-line impedance of about 20 to 200Ω. When the protection diode 204 is fabricated using a design similar to one used for an integrated photodiode, such as those illustrated in U.S. patent application Ser. No. 10/877,915 titled Light Emitting Device With an Integrated Monitor Photodiode previously cited herein, the protection diode 204 may have a reverse bias breakdown voltage, a voltage where current flows somewhat freely in the reverse bias direction shown as direction 232, of around 30V. Thus, while the protection diode 204 may provide some protection from forward biased ESDs onto the VCSEL 202, damage may still result to the VCSEL 202 because current is not significantly sourced away from the VCSEL 202 below 30V.

One way of optimizing the protection diode 204 for better protection of the VCSEL is by increasing the doping in the n type layer such that it is heavily doped. Such doping may be for example in the range of $10^{18}$ to several times $10^{19}$ atoms per $cm^3$. Higher doping in the n type layer correlates directly to lower breakdown voltages in the protection diode 204. In one embodiment, it may be desirable to design a protection diode with a breakdown voltage of about 3V, and a series resistance of about 20Ω or less. The protection diode 204, in this example, functions as a Zener diode.

While the protection diode 204 has been optimized for use in protecting the VCSEL 202, it may also be used as a monitor photodiode when the need for ESD protection has been reduced or abated. As described above, a three terminal device may include ESD protection functionality and photodiode monitoring functionality depending on the interconnection (or non-interconnection) of the terminals.

While not explicitly shown here, other embodiments of the invention may also be implemented. For example, by using a semi-insulating layer and appropriate interconnections, a structure may be implemented that includes a VCSEL, a protection diode, and a photodiode. The VCSEL in this embodiment may be implemented in a fashion as shown in FIGS. 2 and 3. The protection diode may be implemented in a location similar to the location shown for the protection diode in FIG. 3. The photodiode may be implemented in a location similar to where the protection diode is shown in FIG. 2. As mentioned previously, to implement this embodiment, the epitaxial structure would be similar to those shown in FIGS. 2 and 3 except that a semi-insulating layer may be used below the n type layer 216. Additionally, the metal deposition 228 may include discontinuities to separate the photodiode and protection diode. Also, various other interconnections, whether formed by wire-bonding, metal depositions, or otherwise may be needed to appropriately interconnect the diodes to provide the VCSEL protection and photodiode functionality.

Additionally, while the VCSELs shown in the drawings herein are shown as mesa structure VCSELs, other types of VCSELs may be implemented. For example, proton implant VCSELs, oxide VCSELs and the like may be protected using the techniques illustrated herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A semiconductor device comprising:
a monolithic structure, wherein the monolithic structure comprises:
   a vertical cavity surface emitting laser (VCSEL);
   a photodiode coupled to the VCSEL, wherein the photodiode is located in a vertical axis with the VCSEL; and
   a protection diode removed from the vertical axis, coupled to the VCSEL wherein the protection diode cathode is electrically coupled to the VCSEL anode and the protection diode anode is electrically coupled to the VCSEL cathode so as to provide electrostatic discharge (ESD) protection to the VCSEL, the protection diode positioned in one or more layers of the monolithic structure, the photodiode positioned in the same one or more layers.

2. The semiconductor device of claim 1, wherein the monolithic structure further comprises a metal layer below the one or more layers in which the photodiode and the protection diode are positioned, the metal layer including a discontinuity to separate the photodiode and the protection diode.

* * * * *

UNITED STATES PATENT AND TRADEMARK OFFICE
CERTIFICATE OF CORRECTION

| | |
|---|---|
| PATENT NO. | : 7,508,047 B2 |
| APPLICATION NO. | : 11/091179 |
| DATED | : March 24, 2009 |
| INVENTOR(S) | : Tatum et al. |

Page 1 of 1

It is certified that error appears in the above-identified patent and that said Letters Patent is hereby corrected as shown below:

Column 1
Line 25, change "device" to --devices--

Column 2
Line 54, after "with" change "a" to --an--

Column 4
Line 14, change "layers" to --layer--
Line 26, before "an" delete "and"

Column 5
Line 63, change "204." to --204 as shown in FIG. 2--

Column 6
Line 52, change "otherwise" to --otherwise,--

Signed and Sealed this

Twenty-third Day of February, 2010

David J. Kappos
*Director of the United States Patent and Trademark Office*